US009524952B2

(12) United States Patent
Yoon

(10) Patent No.: US 9,524,952 B2
(45) Date of Patent: Dec. 20, 2016

(54) SEMICONDUCTOR SYSTEM

(71) Applicant: SK hynix Inc., Gyeonggi-do (KR)

(72) Inventor: Young-Jun Yoon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/983,285

(22) Filed: Dec. 29, 2015

(65) Prior Publication Data
US 2016/0133607 A1 May 12, 2016

Related U.S. Application Data

(62) Division of application No. 14/199,632, filed on Mar. 6, 2014, now Pat. No. 9,324,452.

(30) Foreign Application Priority Data
Nov. 5, 2013 (KR) ........................ 10-2013-0133532

(51) Int. Cl.
G11C 29/02 (2006.01)
G01R 31/04 (2006.01)
G11C 29/12 (2006.01)
G11C 11/40 (2006.01)
H01L 25/065 (2006.01)
H01L 23/48 (2006.01)

(52) U.S. Cl.
CPC ......... *H01L 25/0657* (2013.01); *G11C 29/025* (2013.01); *G11C 29/1201* (2013.01); *H01L 23/481* (2013.01); *G11C 11/40* (2013.01); *H01L 2225/06541* (2013.01); *H01L 2225/06596* (2013.01); *H01L 2924/0002* (2013.01)

(58) Field of Classification Search
CPC .......................... G11C 29/025; G11C 29/1201
See application file for complete search history.

(56) References Cited

U.S. PATENT DOCUMENTS

2003/0218477 A1* 11/2003 Jang .................... H04L 25/0298
326/30
2005/0088150 A1* 4/2005 Hamanaka ........... G11C 7/1048
323/208
2007/0103189 A1* 5/2007 Chang ................ G01R 31/3172
326/30
2011/0093224 A1* 4/2011 Ide ......................... G11C 29/02
702/64

* cited by examiner

Primary Examiner — Raj R Gupta
(74) Attorney, Agent, or Firm — IP & T Group LLP

(57) ABSTRACT

A semiconductor system may include first semiconductor device including a first pad, a second pad and a first test input pad, and suitable for storing data inputted in series through the first test input pad and outputting the stored data in parallel through the first pad and the second pad; a second semiconductor device including a third pad, a fourth pad and a second test output pad, and suitable for storing data inputted in parallel through the third pad and the fourth pad, a first through via connecting the first pad and the third pad so that the stored data outputted in parallel through the first pad is inputted in parallel through the third pad; and a second through via connecting the second pad and the fourth pad so that the stored data outputted in parallel through the second pad is inputted in parallel through the fourth pad.

10 Claims, 8 Drawing Sheets

SEMICONDUCTOR SYSTEM

CROSS-REFERENCE TO RELATED APPLICATIONS

This application is a division of U.S. patent application Ser. No. 14/199,632 filed on Mar. 6, 2014, which claims priority of Korean Patent Application No. 10-2013-0133532, filed on Nov. 5, 2013. The disclosure of each of the foregoing applications is incorporated herein by reference in its entirety.

BACKGROUND

1. Field

Various embodiments of the present invention relate to a semiconductor system and more particularly to a semiconductor system capable of testing through vias connecting the semiconductor devices included in the semiconductor system.

2. Description of the Related Art

As semiconductor devices trend toward high performance and a high degree of integration, the number of interface pads for exchanging data has increased. Generally, semiconductor device may use a boundary scan test to check whether or not a fail has occurred in a junction state between an external input channel and an interface pad. The boundary scan test refers to a scheme in which test data are transferred to corresponding interface pads through a plurality of input channels. The test data transferred through the interface pads are buffered and latched internally and are outputted to an outside of a semiconductor device through boundary scan paths. The outputted data are scanned to check whether or not a fail has occurred in a junction state.

Semiconductor devices, such as a DRAM, have undergone changes to satisfy various demands. Among these changes, may be a change in a structural aspect. An example of a change in a structural aspect is a multi-chip package (MCP). The multi-chip package is a package chip which includes a plurality of chips. Packaging technologies for semiconductor devices have been developed to meet demands for miniaturization and high capacity. Various technologies for a stack package capable of satisfying not only miniaturization and high capacity but also mounting efficiency are being developed.

A stack package may be fabricated by a method in which individual semiconductor chips are stacked then the stacked semiconductor chips are packaged together or a method in which individual packaged semiconductor chips are stacked. Stacked semiconductor packages employing through-silicon vias (TSVs) are becoming widely used. The stacked semiconductor package is realized by defining via holes to pass through semiconductor devices, filling a conductive material in the via holes thus forming through electrodes which are called the through-silicon vias, and electrically connecting stacked semiconductor devices by the through electrodes.

The stacked semiconductor package may operate normally only when the through-silicon vias are properly formed. Accordingly, whether or not through-silicon vias are normally formed is tested in a variety of ways in the fabricating procedure of a semiconductor package.

SUMMARY

Various embodiments are directed to a semiconductor system capable of testing whether or not through vias connecting the semiconductor devices included in the semiconductor system are normally formed.

Additionally, various embodiments are directed to a semiconductor system capable of minimizing a circuit area necessary for testing through vias, by performing a test using a circuit included in a semiconductor device.

In an embodiment according to the present invention, a semiconductor system may include, a first semiconductor device including a first pad, a second pad and a first test input pad, suitable for storing data inputted in series through the first test input pad and outputting the stored data in parallel through the first pad and the second pad, a second semiconductor device including a third pad, a fourth pad and a second test output pad, suitable for storing data inputted in parallel through the third pad and the fourth pad, a first through via connecting the first pad and the third pad, and a second through via connecting the second pad and the fourth pad.

The first semiconductor device may include a first test output pad, a first selection unit suitable for selecting one of the data inputted through the first test input pad and data inputted through the first pad, a first storage unit suitable for storing and outputting the data selected by the first selection unit, a second selection unit suitable for selecting one of the data outputted from the first storage unit and data outputted from a first internal circuit, a third selection unit suitable for selecting one of the data outputted from the first storage unit and data inputted through the second pad, a second storage unit suitable for storing and outputting the data selected by the third selection unit, and a fourth selection unit suitable for selecting one of the data outputted from the second storage unit and the data outputted from the first internal circuit.

The second semiconductor device may include a second test input pad, a fifth selection unit suitable for selecting one of data inputted through the second test input pad and data inputted through the third pad, a third storage unit suitable for storing and outputting the data selected by the fifth selection unit, a sixth selection unit suitable for selecting one of the data outputted from the third storage unit and data outputted from a second internal circuit, a seventh selection unit suitable for selecting one of the data outputted from the third storage unit and data inputted through the fourth pad, a fourth storage unit suitable for storing and outputting the data selected by the seventh selection unit, and an eighth selection unit suitable for selecting one of the data outputted from the fourth storage unit and the data outputted from the second internal circuit.

In another embodiment according to the present invention, a semiconductor system may include first to $N^{th}$ semiconductor devices each having a plurality of pads, the first to $N^{th}$ semiconductor devices being sequentially stacked so that the plurality of pads of adjacent semiconductor devices may be connected by through vias. The first semiconductor device may further include a test input pad, stores data inputted in series through the test input pad, and outputs in parallel the stored data through corresponding pads among the plurality of pads. The $N^{th}$ semiconductor device may further include a test output pad, stores the data inputted in parallel through the corresponding pads among the plurality of pads, and outputs in series the stored data through the test output pad.

In another embodiment according to the present invention, a semiconductor system may include a first semiconductor device including a first pad, a second pad, a first test input pad, a first output buffer which has a first resistance value and drives the first pad with a voltage corresponding to an output value and a second output buffer which has the first resistance value and drives the second pad with a voltage corresponding to an output value, and suitable for storing data inputted in series through the first test input pad and outputting the stored data in parallel through the first pad and the second pad, a second semiconductor device including a third pad, a fourth pad, a second test input pad, a second test output pad, a third output buffer, which has a second resistance value larger than the first resistance value and drives the third pad with a voltage corresponding to an output value and a fourth output buffer which has the second resistance value and drives the fourth pad with a voltage corresponding to an output value, and suitable for inputting in series and storing data through the second test input pad, which are different from the data inputted through the first test input pad, and outputting in parallel the stored data through the third pad and the fourth pad, a first through via connecting the first pad and the third pad, and a second through via connecting the second pad and the fourth pad.

The first semiconductor device may further include a first test output pad, a first selection unit suitable for selecting one of data inputted through the first test input pad and data inputted through the first pad, a first storage unit suitable for storing and outputting the data selected by the first selection unit, a second selection unit suitable for selecting one of the data outputted from the first storage unit and data outputted from a first internal circuit, a third selection unit suitable for selecting one of the data outputted from the first storage unit and data inputted through the second pad, a second storage unit suitable for storing and outputting the data selected by the third selection unit, and a fourth selection unit suitable for selecting one of the data outputted from the second storage unit and the data outputted from the first internal circuit.

The second semiconductor device may further include a fifth selection unit suitable for selecting one of data inputted through the second test input pad and data inputted through the third pad, a third storage unit suitable for storing and outputting the data selected by the fifth selection unit, a sixth selection unit suitable for selecting one of the data outputted from the third storage unit and data outputted from a second internal circuit, a seventh selection unit suitable for selecting one of the data outputted from the third storage unit and data inputted through the fourth pad, a fourth storage unit suitable for storing and outputting the data selected by the seventh selection unit, and an eighth selection unit suitable for selecting one of the data outputted from the fourth storage unit and the data outputted from the second internal circuit.

In another embodiment according to the present invention, a semiconductor system may include first to $N^{th}$ semiconductor devices each including a plurality of pads, the first to $N^{th}$ semiconductor devices being sequentially stacked so that the plurality of pads of adjacent semiconductor devices may be connected by through vias, respectively. The first semiconductor device includes a first test input pad and a plurality of first output buffers which have a first resistance value and drive the plurality of corresponding pads with voltages corresponding to output values, stores data inputted in series through the first test input pad, and outputs in parallel the stored data through the plurality of pads. The $N^{th}$ semiconductor device includes an $N^{th}$ test input pad, an $N^{th}$ test output pad and a plurality of $N^{th}$ output buffers, which have a second resistance value larger than the first resistance value and drive the plurality of respective pads with voltages corresponding to output values, inputs in series and stores through the $N^{th}$ test input pad, which are different from the data inputted through the first test input pad, and outputs in parallel the stored data through the plurality of pads.

DETAILED DESCRIPTION

Figure 1:
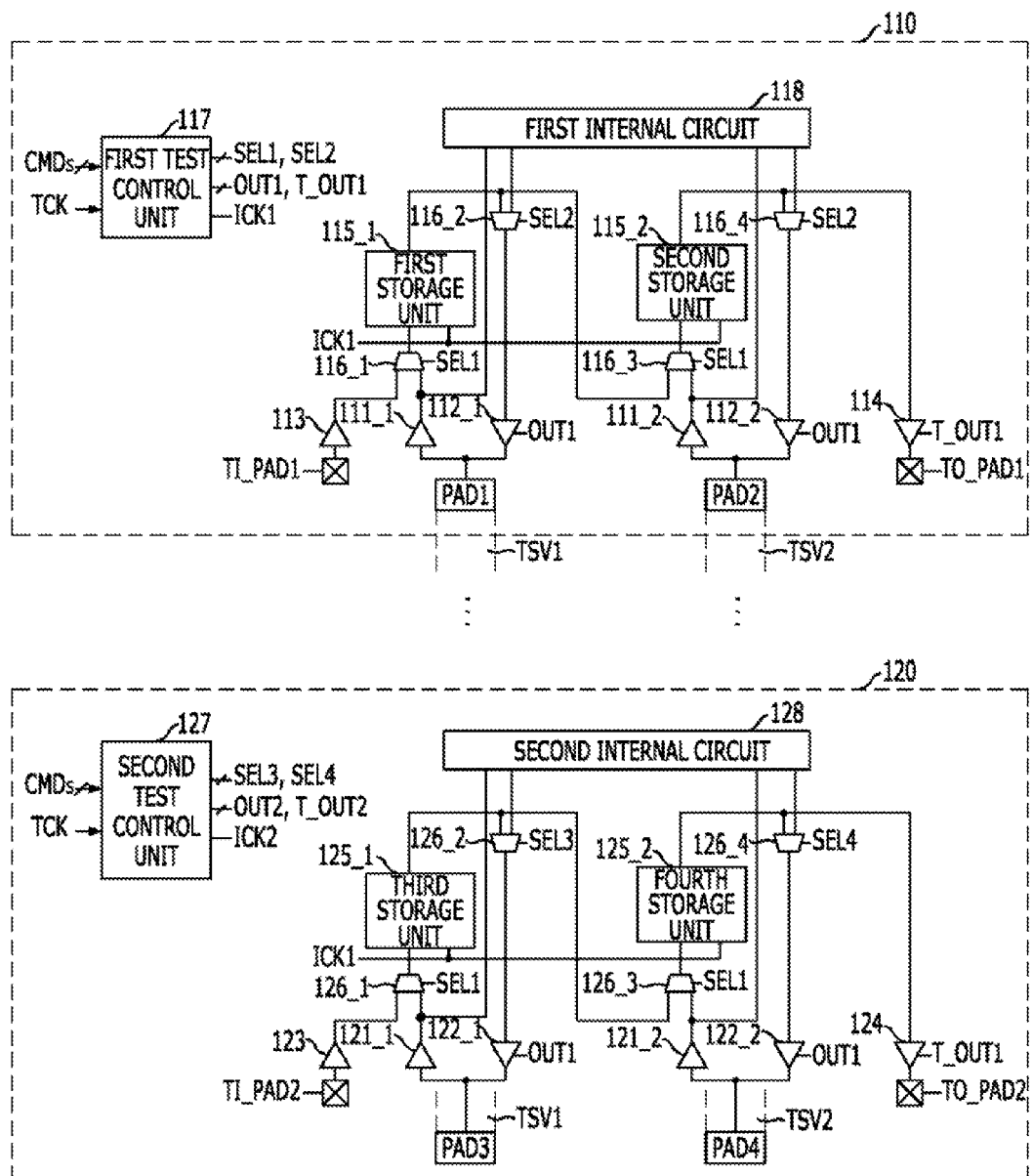
FIG. 1 is a diagram illustrating a semiconductor system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a diagram illustrating a semiconductor system in accordance with an embodiment of the present invention.

Referring to FIG. 1, a semiconductor system may include through vias TSV1 and TSV2, a first semiconductor device 110, and a second semiconductor device 120. The first semiconductor device 110 may include pads PAD1 and PAD2, a first test input pad TI_PAD1, a first test output pad TO_PAD1, input buffers 111_1 and 111_2, output buffers 112_1 and 112_2, a first test input buffer 113, a first test output buffer 114, storage units 115_1 and 115_2, selection units 116_1 to 116_4, a first test control unit 117, and a first internal circuit 118. The second semiconductor device 120 may include pads PAD3 and PAD4, a second test input pad TI_PAD2, a second test output pad TO_PAD2, input buffers 121_1 and 121_2, output buffers 122_1 and 122_2, a second test input buffer 123, a second test output buffer 124, storage units 125_1 and 125_2, selection units 126_1 to 126_4, a second test control unit 127, and a second internal circuit 128. The first pad PAD1 and the third pad PAD3 may be connected through the first through vias TSV1, and the second pad PAD2 and the fourth pad PAD4 may be connected through the second through vias TSV2. The second semiconductor device 120 may be a master chip, which performs communication with an outside, and the first semiconductor device 110 may be a slave chip.

The first semiconductor device 110 may input/output data through the first pad PAD1 and the second pad PAD2. The first semiconductor device 110 may be a memory device. When the first semiconductor device 110 is a memory device, the first pad PAD1 and the second pad PAD2 may be pads for being inputted with commands or addresses or pads for inputting/outputting data. The first input buffer 111_1 and the second input buffer 111_2 may respectively correspond to the first pad PAD1 and the second pad PAD2, and may buffer the data inputted through the corresponding pads. The first output buffer 112_1 and the second output buffer 112_2 may respectively correspond to the first pad PAD1 and the second pad PAD2, and may buffer data to be outputted to the corresponding pads.

In a test operation, the first semiconductor device 110 may be inputted with data through the first test input pad TI_PAD1 and may output stored data to the first test output pad TO_PAD1. The first test input buffer 113 may buffer the data inputted through the first test input pad TI_PAD1, and the first test output buffer 114 may buffer data to be outputted to the first test output pad TO_PAD1.

The first selection unit 116_1 may select one of the data inputted through the first test input pad TI_PAD1 and the data inputted through the first pad PAD1. The first storage unit 115_1 may store and output the data selected by the first selection unit 116_1. The second selection unit 116_2 may select one of the data outputted from the first storage unit 115_1 and the data outputted from the first internal circuit 118. The third selection unit 116_3 may select one of the data outputted from the first storage unit 115_1 and the data inputted through the second pad PAD2. The second storage unit 115_2 may store and output the data selected by the third selection unit 116_3. The data outputted from the second storage unit 115_2 may be transferred to the first test output pad TO_PAD1. The fourth selection unit 116_4 may select one of the data outputted from the second storage unit 115_2 and the data outputted from the first internal circuit 118. The first storage unit 115_1 and the second storage unit 115_2 may be D-flip flops, which operate in synchronization with a clock ICK1.

The first test control unit 117 may generate a plurality of control signals SEL1, SEL2, OUT1, T_OUT1 and ICK1 in response to a plurality of external signals CMDs and TCK, which are transferred from an outside of the first semiconductor device 110. CMDs may be command signals for setting the operations of the first semiconductor device 110, and TCK may be the source signal of the clock ICK1 used in a test. The command signals CMDs may include a command signal, which is applied to only the first semiconductor device 110, and a command signal, which is applied to both the first semiconductor device 110 and the second semiconductor device 120. The first semiconductor device 110 may perform a different operation from the second semiconductor device 120, by applying the command signal to only the first semiconductor device 110. Additionally, the first semiconductor device 110 may include pads and through vias for applying a plurality of external signals CMDs and TCK.

A first select signal SEL1 is a signal for controlling the first selection unit 116_1 and the third selection unit 116_3, a second select signal SEL2 is a signal for controlling the second selection unit 116_2 and the fourth selection unit 116_4, a first output signal OUT1 is a signal for controlling the first output buffer 112_2 and the second output buffer 112_2, and a first test output signal T_OUT1 is a signal for controlling the first test output buffer 114.

The first internal circuit 118 may perform a predetermined operation in response to the signals inputted through the first pad PAD1 and the second pad PAD2, and may output a result of the predetermined operation to the first pad PAD1 and the second pad PAD2. When the first semiconductor device 110 is a memory device, in a write operation, the first internal circuit 118 may store the data inputted through the first pad PAD1 and the second pad PAD2, or in a read operation, may output stored data through the first pad PAD1 and the second pad PAD2.

The descriptions of the pads PAD3 and PAD4, the second test input pad TI_PAD2, the second test output pad TO_PAD2, the input buffers 121_1 and 121_2, the output buffers 122_1 and 122_2, the second test input buffer 123, the second test output buffer 124, the storage units 125_1 and 125_2, the selection units 126_1 to 126_4, the second test control unit 127 and the second internal circuit 128 of the second semiconductor device 120 are respectively the same as the descriptions of the pads PAD1 and PAD2, the first test input pad TI_PAD1, the first test output pad TO_PAD1, the input buffers 111_1 and 111_2, the output buffers 112_1 and 112_2, the first test input buffer 113, the first test output buffer 114, the storage units 115_1 and 115_2, the selection units 116_1 to 116_4, the first test control unit 117 and the first internal circuit 118 of the first semiconductor device 110.

The second test control unit 127 of the second semiconductor device 120 may generate a plurality of control signals SEL3, SEL4, OUT2, T_OUT2 and ICK2 in response to a plurality of external signals CMDs and TCK. The command signals CMDs may include a command signal, which is applied only to the second semiconductor device 120.

In a via test operation, the semiconductor devices 110 and 120 may generally perform four operations: a serial input operation, a serial output operation, a parallel input operation and a parallel output operation. The four operations will be described referring to the first semiconductor device 110. Internal clocks ICK1 and ICK2 may be activated in the test operation.

When the command signals CMDs correspond to a serial input operation, the first test control unit 117 may generate the first select signal SEL1 so that the first selection unit 116_1 selects the data inputted through the first test input pad TI_PAD1 and the third selection unit 116_3 selects the data outputted from the first storage unit 115_1. The first storage unit 115_1 and the second storage unit 115_2 may perform a shifting operation in response to the internal clock ICK1. Therefore, if 2 or more-bit data are inputted in series through the first test input pad TI_PAD1, the inputted data may be stored in the second storage unit 115_2 through the first storage unit 115_1. For example, when storing 2-bit data, if a first inputted bit is "1" and a second inputted bit is "0", the first inputted bit may be shifted to the second storage unit 115_2 through the first storage unit 115_1 and may be stored in the second storage unit 115_2, and the second inputted bit may be stored in the first storage unit 115_1. That is, "0" may be stored in the first storage unit 115_1, and "1" may be stored in the second storage unit 115_2.

When the command signals CMDs correspond to a serial output operation, the first test control unit 117 may generate the first select signal SEL1 so that the third selection unit 116_3 selects the data outputted from the first storage unit 115_1 and may generate the first test output signal T_OUT1 so that the first test output buffer 114 is activated. The first storage unit 115_1 and the second storage unit 115_2 may perform a shifting operation in response to the internal clock ICK1. Therefore the data stored in the second storage unit 115_2 and the data stored in the first storage unit 115_1 may be sequentially outputted to the first test output pad TO_PAD1. For example, when "0" is stored in the first storage unit 115_1 and "1" is stored in the second storage unit 115_2, the "1" stored in the second storage unit 115_2 may be outputted first, and then the "0" stored in the first storage unit 115_1 may be outputted through the second storage unit 115_2.

When the command signals CMDs correspond to a parallel input operation, the first test control unit 117 may generate the first select signal SEL1 so that the first selection unit 116_1 selects the data inputted through the first pad PAD1 and the third selection unit 116_3 selects the data inputted through the second pad PAD2. The first storage unit 115_1 may store the data inputted through the first pad PAD1 in response to the internal clock ICK1, and the second storage unit 115_2 may store the data inputted through the second pad PAD2 in response to the internal clock ICK1.

When the command signals CMDs correspond to a parallel output operation, the first test control unit 117 may generate the second select signal SEL2 so that the second selection unit 116_2 selects the data stored in the first storage unit 115_1 and the fourth selection unit 116_4 selects the data outputted from the second storage unit 115_2. The first storage unit 115_1 and the second storage unit 115_2 may output stored data in response to the internal clock ICK1, and the data outputted from the first storage unit 115_1 may be outputted to the first pad PAD1, and the data outputted from the second storage unit 115_2 may be outputted to the second pad PAD2.

Hereinafter, the via test operation of the semiconductor system will be described.

As the first semiconductor device 110 performs the serial input operation, the respective bits of the data serially inputted through the first test input pad TI_PAD1 may be stored in the first storage unit 115_1 and the second storage unit 115_2. For example, in the case where "0" and "1" are sequentially inputted, "0" may be stored in the second storage unit 115_2 and "1" may be stored in the first storage unit 115_1. For reference, the data inputted through the first test input pad TI_PAD1 may be data with a preset pattern.

Next, the first semiconductor device 110 may perform the parallel output operation, and at the same time, the second semiconductor device 120 may perform the parallel input operation. The "1" stored in the first storage unit 115_1 may be outputted to the first pad PAD1 and may then be inputted to the third pad PAD3 through the first through via TSV1. Similarly, the "0" stored in the second storage unit 115_2 may be outputted to the second pad PAD2 and may then be inputted to the fourth pad PAD4 through the second through via TSV2. A "1" inputted to the third pad PAD3 may be stored in the third storage unit 125_1 and a "0" inputted to the fourth pad PAD4 may be stored in the fourth storage unit 125_2. If the through vias TSV1 and TSV2 are normally formed, the data stored in the first storage unit 115_1 and the second storage unit 115_2 may be stored the same in the third storage unit 125_1 and the fourth storage unit 125_2. Otherwise, the data stored in the third storage unit 125_1 and the fourth storage unit 125_2 may be different from the data stored in the first storage unit 115_1 and the second storage unit 115_2.

Finally, as the second semiconductor device 120 performs the serial output operation, the data stored in the fourth storage unit 125_2 and the data stored in the third storage unit 125_1 may be sequentially outputted. In the above case, "0" and "1" may be sequentially outputted.

Since the data stored in the first semiconductor device 110 are normally transferred to the second semiconductor device 120 when the through vias TSV1 and TSV2 are normally formed, the data sequentially inputted through the first test input pad TI_PAD1 and the data sequentially outputted through the second test output pad TO_PAD2 should have the same pattern. Accordingly, by comparing the data sequentially inputted through the first test input pad TI_PAD1 and the data sequentially outputted through the second test output pad TO_PAD2, it is possible to determine whether or not the through vias TSV1 and TSV2 are normally formed. To compare the two data, the semiconductor system may include separate storage units (not shown) in the semiconductor devices 110 and 120 or may include test equipment (not shown), which is connected with the semiconductor devices 110 and 120.

When the first semiconductor device 110 performs a normal data input operation such as a write operation, the data inputted through the pads PAD1 and PAD2 may be transferred to the first internal circuit 118. When the first semiconductor device 110 performs a normal data output operation such as a read operation, the data transferred from the first internal circuit 118 may be outputted to the pads PAD1 and PAD2 through the selection units 116_2 and 116_4. Operations of the second semiconductor device 120 are similar to these descriptions.

The semiconductor system may test whether or not through vias are normally formed by using the circuits, which perform the predetermined operations as described above. For increased efficiency, the semiconductor system may perform a via test operation using circuits, which are included for another test, for example, a boundary scan test.

Figure 2:
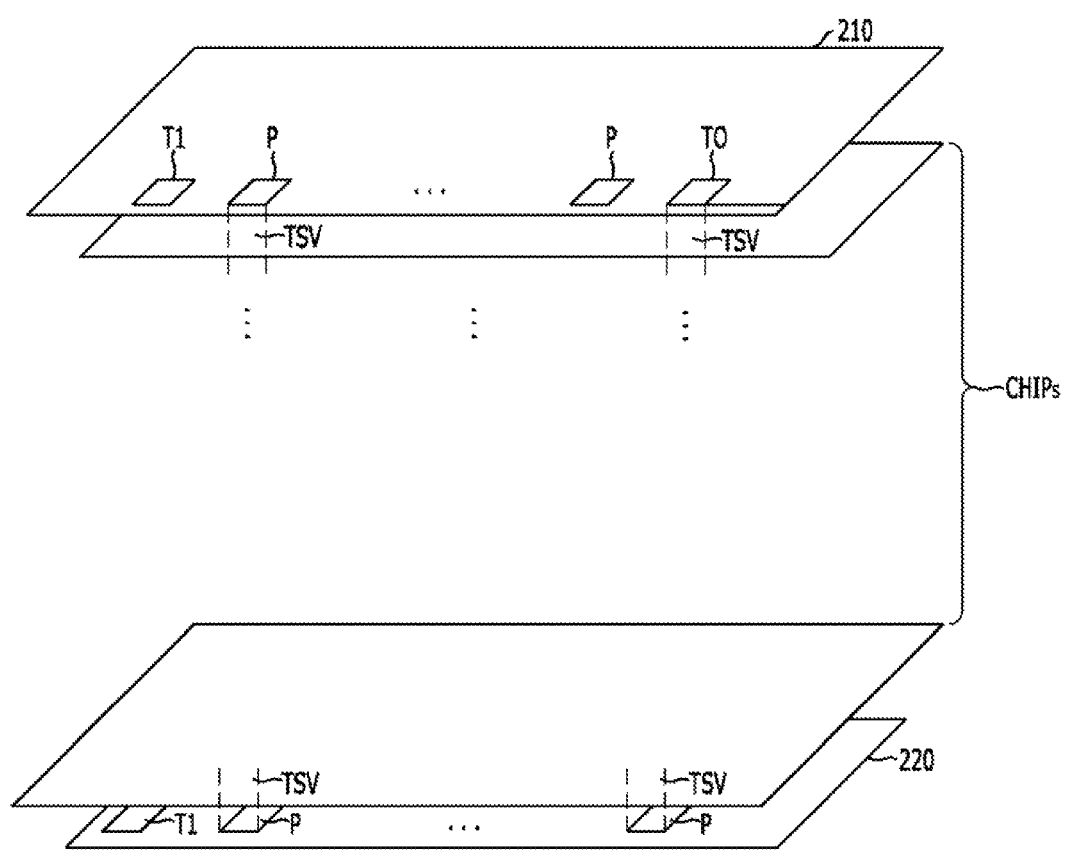
FIG. 2 is a diagram illustrating a semiconductor system in accordance with an embodiment of the present invention.

FIG. 2 is a diagram illustrating a semiconductor system in accordance with an embodiment of the present invention.

The semiconductor system of FIG. 2 may include first to $N^{th}$ semiconductor devices 210, CHIPs and 220. The first to $N^{th}$ semiconductor devices 210, CHIPs and 220 may be stacked. In the semiconductor system, the first semiconductor device 210 may be an uppermost stacked semiconductor device, the $N^{th}$ semiconductor device 220 may be a lowermost stacked semiconductor device, and the remaining semiconductor devices CHIPs may be semiconductor devices which are stacked between the first semiconductor device 210 and the $N^{th}$ semiconductor device 220. Each of the first to $N^{th}$ semiconductor devices 210, CHIPs and 220 may include a plurality of pads P. The pluralities of pads P of the semiconductor devices stacked adjacent to each other may be connected through the through vias TSV. FIG. 2 shows only respective pads P, TI and TO and through vias TSV of the first and $N^{th}$ semiconductor devices 210 and 220 and the stacked shape of the remaining semiconductor devices CHIPs.

Figure 3:
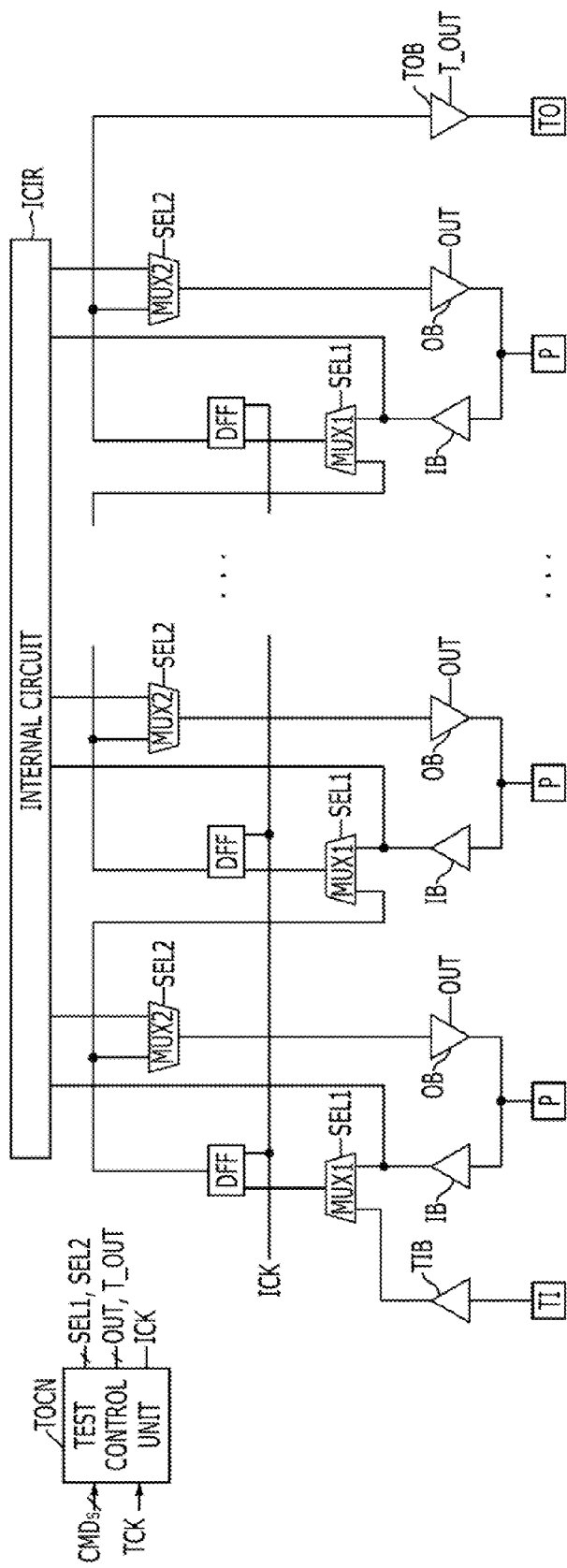
FIG. 3 is a diagram illustrating the first semiconductor device shown in FIG. 2.

FIG. 3 is a diagram illustrating the first semiconductor device 210 shown in FIG. 2. As shown in FIG. 3, the first semiconductor device 210 may include pads P, a test input pad TI, a test output pad TO, input buffers IB, output buffers OB, a test input buffer TIB, a test output buffer TOB, storage units DFF, selection units MUX1 and MUX2, a test control unit TCON, and an internal circuit ICIR.

The first semiconductor device 210 may input/output data through the pads P. Among the pads P, are command pads, address pads, and data pads. The input buffers IB may buffer the data inputted through the pads P and the output buffers OB may buffer data to be outputted to the pads P.

Data to be stored in the first semiconductor device 210 may be inputted in series through the test input pad TI in a serial input operation, and the data stored in the first semiconductor device 210 may be outputted in series through the test output pad TO in a serial output operation. The test Input buffer TIB may buffer the data inputted through the test input pad TI, and the test output buffer TOB may buffer data to be outputted through the test output pad TO.

Each selection unit MUX1, which is connected to the input terminal (D) of each storage unit DFF, may select one of the data outputted through the output terminal (Q) of the storage unit DFF corresponding to a previous stage or the data inputted through the test input pad TI, and the data inputted through the corresponding pad P. Each selection unit MUX2, which is connected to the output terminal (Q) of each storage unit DFF, may select one of the data outputted from the storage unit DFF and the data outputted from the internal circuit ICIR.

The test control unit TCON may generate control signals SEL1, SEL2, OUT, T_OUT and ICK in response to a plurality of external signals CMDs and TCK. Additionally, the first semiconductor device 210 may include pads and through vias for applying a plurality of external signals CMDs and TCK, which are not shown for convenience in illustration.

When the command signals CMDs correspond to a serial input operation, the test control unit TCON may generate a first select signal SEL1 so that each selection unit MUX1 selects the data outputted from the storage unit DFF corresponding to a previous stage or the data inputted through the test input pad TI. Each storage unit DFF may perform a shifting operation in response to an internal clock ICK. Therefore, the data inputted through the test input pad TI may be sequentially stored in the storage units DFF, starting from the storage unit DFF, which is adjacent to the test output pad TO.

When the command signals CMDs correspond to a serial output operation, the test control unit TCON may generate the first select signal SEL1 so that each selection unit MUX1 selects the data outputted from the storage unit DFF corresponding to a previous stage, and may activate a test output signal T_OUT so that the test output buffer TOB is activated. Each storage unit DFF may perform a shifting operation in response to the internal clock ICK. Therefore, the bits stored in the storage units DFF may be sequentially outputted, starting from the storage unit DFF which is adjacent to the test output pad TO.

When the command signals CMDs correspond to a parallel input operation, the test control unit TCON may generate the first select signal SEL1 so that each selection unit MUX1 selects the data inputted to its corresponding pad P. The data inputted to the corresponding pad P may be stored in response to the internal clock ICK.

When the command signals CMDs correspond to a parallel output operation, the test control unit TCON may generate a second select signal SEL2 so that each selection unit MUX2 selects the data outputted from its corresponding storage unit DFF. The storage unit DFF may output stored data in response to the internal clock ICK, and the outputted data may be outputted to the corresponding pad P.

The remaining semiconductor devices CHIPs and 220 have the same configuration as the first semiconductor device 210, and the operations of respective component elements thereof are the same as described above. Hereinafter, a via test operation of the semiconductor system will be described.

As the first semiconductor device 210 performs the serial input operation, the data inputted in series through the test input pad TI may be stored in the plurality of storage units DFF. For reference, the data inputted through the test input pad TI may be data with a preset pattern.

Next, the first semiconductor device 210 may perform the parallel output operation, and at the same time, the $N^{th}$ semiconductor device 220 may perform the parallel input operation. The remaining semiconductor devices CHIPs may perform the parallel input operation similarly to the $N^{th}$ semiconductor device 220. When through vias TSV are normally formed, the data outputted to the plurality of pads P of the first semiconductor device 210 may be inputted to the plurality of pads P of the $N^{th}$ semiconductor device 220 and may be stored in the plurality of storage units DFF. Otherwise, data different from the data outputted from the first semiconductor device 210 may be stored in the $N^{th}$ semiconductor device 220.

As the $N^{th}$ semiconductor device 220 performs the serial output operation, stored data may be sequentially outputted through the test output pad TO. By comparing the data inputted through the test input pad TI of the first semiconductor device 210 and the data outputted through the test output pad TO of the $N^{th}$ semiconductor device 220, a via test may be performed.

When three or more semiconductor devices are stacked, a via test may be performed by storing data in series in an uppermost stacked semiconductor device and then storing the stored data in a lowermost stacked semiconductor device through parallel input/output operations.

Figure 4:
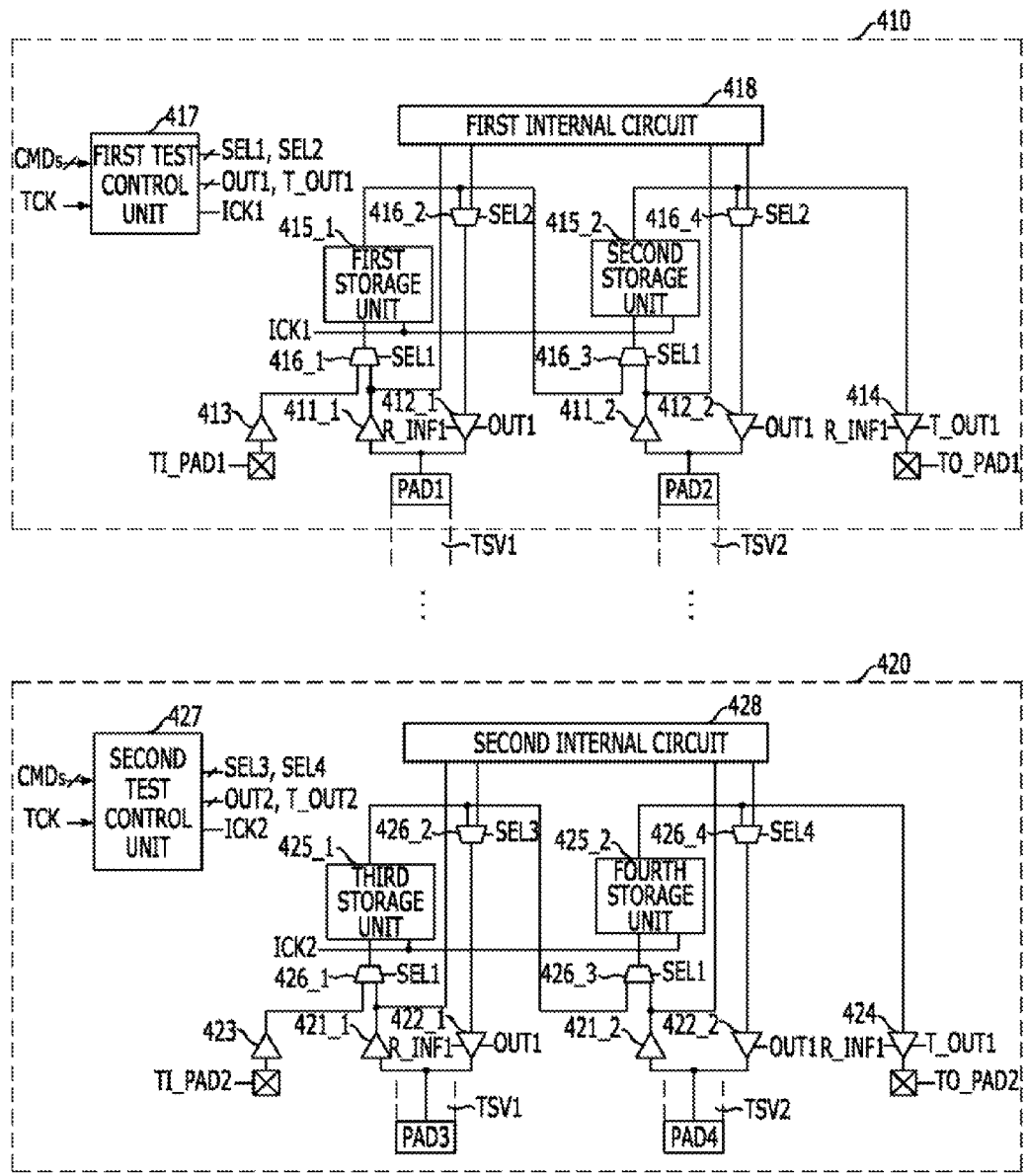
FIG. 4 is a diagram illustrating a semiconductor system in accordance with an embodiment of the present invention.

FIG. 4 is a diagram illustrating a semiconductor system in accordance with an embodiment of the present invention.

Referring to FIG. 4, a semiconductor system may include through vias TSV1 and TSV2, a first semiconductor device 410, and a second semiconductor device 420. The first semiconductor device 410 may include pads PAD1 and PAD2, a first test input pad TI_PAD1, a first test output pad TO_PAD1, input buffers 411_1 and 411_2, output buffers 412_1 and 412_2, a first test input buffer 413, a first test output buffer 414, storage units 415_1 and 415_2 selection units 416_1 to 416_4, a first test control unit 417, and a first internal circuit 418. The second semiconductor device 420 may include pads PAD3 and PAD4, a second test input pad TI_PAD2, a second test output pad TO_PAD2 input buffers 421_1 and 421_2 output buffers 422_1 and 422_2, a second test input buffer 423, a second test output buffer 424, storage units 425_1 and 425_2, selection units 426_1 to 426_4, a second test control unit 427, and a second internal circuit 428. The first pad PAD1 and the third pad PAD3 may be connected through the first through via TSV1 and the second pad PAD2 and the fourth pad PAD4 may be connected through the second through via TSV2. Additionally, the second semiconductor device 420 may be a master chip, which performs communication with an outside, and the first semiconductor device 410 may be a slave chip.

In the semiconductor system of FIG. 4, the resistance values of the output buffers 412_1, 412_2, 422_1 and 422_2 may be controlled. In a via test operation, the resistance values of the output buffers 412_1 and 412_2 of the first semiconductor device 410 and the resistance values of the output buffers 422_1 and 422_2 of the second semiconductor device 420 may be set differently from each other.

The configurations and operations of the semiconductor devices 410 and 420 of FIG. 4 are similar to those of the first semiconductor device 110 of FIG. 1. The semiconductor devices 410 and 420 of FIG. 4 may perform (1) a serial input operation, (2) a serial output operation, (3) a parallel input operation and (4) a parallel output operation according to the control thereof, similar to the first semiconductor device 110 of FIG. 1. Hereinbelow, descriptions will be made primarily for the output buffers 412_1, 412_2, 422_1 and 422_2 of FIG. 4 and a via test operation.

The first output buffer 412_1 and the second output buffer 412_2 respectively correspond to the first pad PAD1 and the second pad PAD2, have a resistance value corresponding to first resistance information R_INF1, and drive the corresponding pads with voltages corresponding to output values. In response to the first resistance information R_INF1, the first output buffer 412_1 and the second output buffer 412_2 may have a first resistance value or a second resistance value larger than the first resistance value. The first output buffer 412_1 and the second output buffer 412_2 may drive the first pad PAD1 and the second pad PAD2 with a power supply voltage VDD corresponding to "high" when their output values are "high", and may drive the first pad PAD1 and the second pad PAD2 with a ground voltage VSS corresponding to "low" when their output values are "low". The third output buffer 422_1 and the fourth output buffer 422_2 may be controlled in their resistance value by second resistance information R_INF2, and may drive the third pad PAD3 and the fourth pad PAD4 in a method similar to the method by the first output buffer 412_1 and the second output buffer 412_2. Additionally, the first semiconductor device 410 may include a pad and a through via for applying the first resistance information R_INF1, and the second semiconductor device 420 may include a pad and a through via for applying the second resistance information R_INF2. Illustration of these pads and through vias is omitted for the sake of convenience.

In the via test operation, the resistance value of the output buffers 412_1 and 412_2 of the first semiconductor device 410 is set to a first resistance value, and the resistance value of the output buffers 422_1 and 422_2 of the second semiconductor device 420 is set to a second resistance value.

Next, as the first semiconductor device 410 performs the serial input operation, the respective bits of the data inputted in series through the first test input pad TI_PAD1 may be stored in the first storage unit 415_1 and the second storage unit 415_2. For example, where "0" and "1" are sequentially inputted, "0" may be stored in the second storage unit 415_2, and "1" may be stored in the first storage unit 415_1. For reference, the data inputted through the first test input pad TI_PAD1 may be data with a preset pattern. As the second semiconductor device 420 performs the serial input operation, the respective bits of the data inputted in series through the second test input pad TI_PAD2 may be stored in the third storage unit 425_1 and the fourth storage unit 425_2. The data stored in the second semiconductor device 420 and the data stored in the first semiconductor device 410 may have different patterns. Particularly, the data stored in the second semiconductor device 420 and the data stored in the first semiconductor device 410 may have opposite patterns. For example, "1" and "0" may be sequentially inputted to the second test input pad TI_PAD2, and "1" may be stored in the fourth storage unit 425_2 and "0" may be stored in the third storage unit 425_1.

The first semiconductor device 410 and the second semiconductor device 420 may simultaneously perform the parallel output operation. The first pad PAD1 and the second pad PAD2 may be driven by the first output buffer 412_1 and the second output buffer 412_2, which have the first resistance value, and the third pad PAD3 and the fourth pad PAD4 may be driven by the third output buffer 422_1 and the fourth output buffer 422_2, which have the second resistance value.

If the pads PAD1 to PAD4 are driven to specified voltages by the output buffers 412_1, 412_2, 422_1 and 422_2 as described above, the second semiconductor device 420 may perform the parallel input operation and may update the data stored in the third storage unit 425_1 and the fourth storage unit 425_2, as values corresponding to the voltages of the third pad PAD3 and the fourth pad PAD4.

Finally, as the second semiconductor device 420 performs the serial output operation, the data stored in the fourth storage unit 425_2 and the data stored in the third storage unit 425_1 may be sequentially outputted. By comparing the data sequentially inputted through the first test input pad TI_PAD1 and the data sequentially outputted through the second test output pad TO_PAD2, if the data are the same with each other, it may be determined that the through vias TSV1 and TSV2 are normally formed. By comparing the data sequentially inputted through the second test input pad TI_PAD2 and the data sequentially outputted through the second test output pad TO_PAD2, if the data have opposite patterns, it may be determined that the through vias TSV1 and TSV2 are normally formed. To compare the two data, the semiconductor system may include separate storage units (not shown) in the semiconductor devices or may include test equipment (not shown), which is connected with the semiconductor devices 410 and 420. When the data are different from each other as a comparison result, it may be determined that the through vias TSV1 and TSV2 are not normally formed.

In the semiconductor system of FIG. 4, when the through vias TSV1 and TSV2 are not normally formed, the data stored in the second semiconductor device 420 are not the same as the data outputted from the first semiconductor device 410 and have values that are originally stored in the second semiconductor device 420. Therefore, a precise test result may be obtained regardless of whether or not the through vias TSV1 and TSV2 are normally formed.

The semiconductor system may test whether or not through vias are normally formed, using the circuits which perform the predetermined operations as described above. Since the circuits are circuits for performing a boundary scan test, the semiconductor system may efficiently perform a via test operation using circuits which are included for another test.

Figure 5:
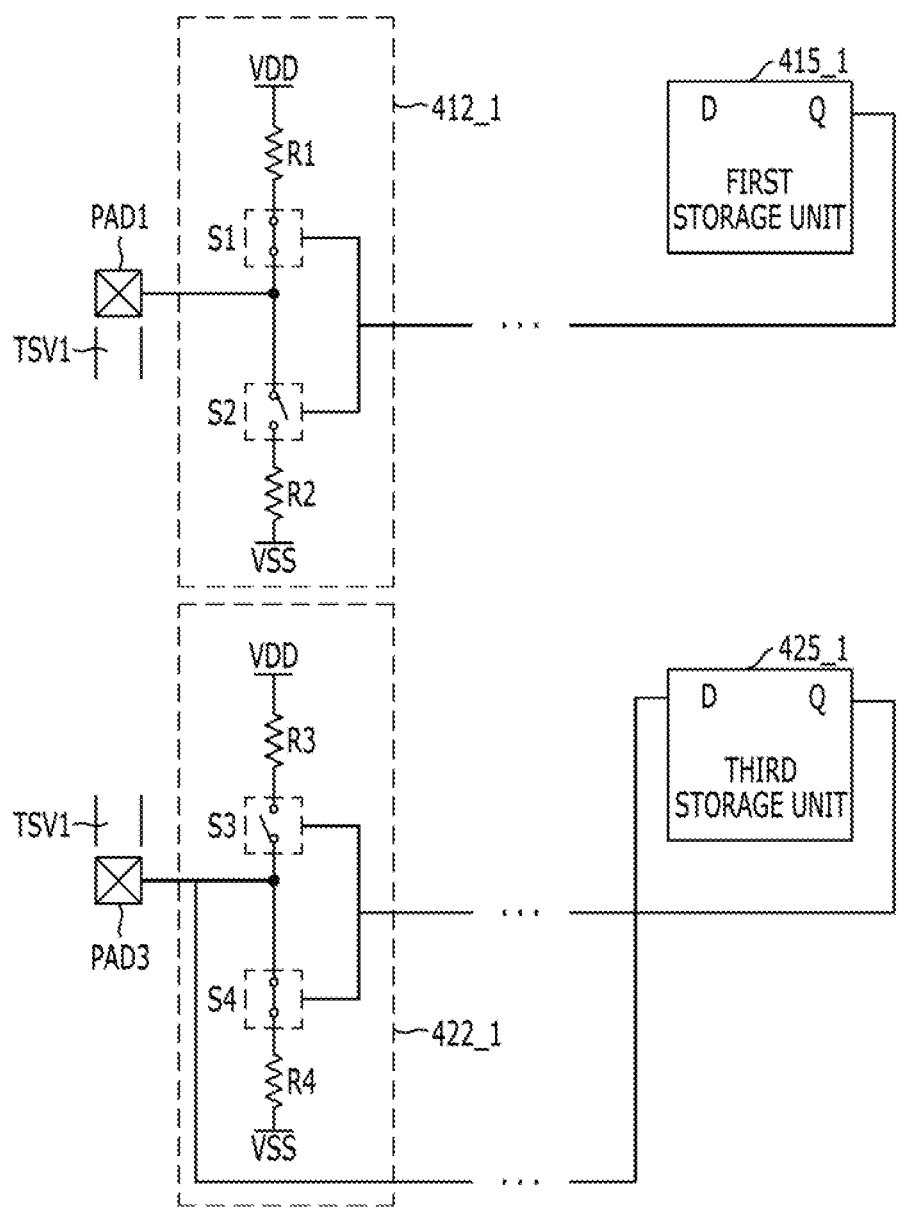
FIG. 5 is a diagram explaining the principle of a via test operation in the semiconductor system of FIG. 4.

FIG. 5 is a diagram describing the principle of a via test operation in the semiconductor system of FIG. 4.

FIG. 5 shows only the first pad PAD1, the first output buffer 412_1, the first storage unit 415_1, the first through via TSV1, the third pad PAD3, the third output buffer 422_1, and the third storage unit 425_1. In the via test operation, the first output buffer 412_1 has the first resistance value, and the third output buffer 422_1 has the second resistance value. Accordingly, in FIG. 5, there are shown equivalent circuits in which the first output buffer 412_1 includes two resistors R1 and R2 having the first resistance value and switching elements S1 and S2 and the third output buffer 422_1 includes two resistors R3 and R4 having the second resistance value and switching elements S3 and S4.

An operation for updating the value stored in the third storage unit 425_1 in the via test operation will be described with reference to FIG. 5.

It is presumed that "high" is stored in the first storage unit 415_1 and "low" is stored in the third storage unit 425_1. In the parallel output operation, the first storage unit 415_1 and the third storage unit 425_1 may output stored values through output terminals Q. The first output buffer 412_1 may drive the first pad PAD1 to the power supply voltage VDD in response to the "high" outputted from the first storage unit 415_1, for example, the switching element S1 is turned on and the switching element S2 is turned off. The third output buffer 422_1 may drive the third pad PAD3 to the ground voltage VSS in response to the "low" outputted from the third storage unit 425_1, for example, the switching element S3 is turned off and the switching element S4 is turned on.

The terminal of the power supply voltage VDD of the first output buffer 412_1 and the terminal of the ground voltage VSS of the third output buffer 422_1 may be electrically connected. The resistor R1, the first through via TSV1 and the resistor R4 may be connected in series between the terminal of the power supply voltage VDD of the first output buffer 412_1 and the terminal of the ground voltage VSS of the third output buffer 422_1. It is presumed that the first resistance value is $R_{VAL1}$, the second resistance value is $R_{VAL2}$, and the resistance value of the first through via TSV1 is $R_{TSV}$. $R_{TSV}$ may be negligibly smaller than $R_{VAL1}$ and $R_{VAL2}$ when the first through via TSV1 is normally formed, and may become markedly larger than $R_{VAL1}$ and $R_{VAL2}$ when the first through via TSV1 is not normally formed. Voltage $V_{PAD3}$ of the third pad PAD3 is expressed as in the following [Mathematical Equation 1]. For reference, a voltage corresponding to "high" is the power supply voltage VDD, and a voltage corresponding to "low" is the ground voltage VSS.

$$V_{PAD3} = \frac{R_{VAL2}}{R_{VAL1} + R_{TSV} + R_{VAL2}}(VDD - VSS) \quad \text{[Mathematical Equation 1]}$$

In [Mathematical Equation 1], since $R_{TSV}$ is negligibly smaller than $R_{VAL1}$ and $R_{VAL2}$ when the first through via TSV1 is normally formed and since $R_{VAL1}<R_{VAL2}$, the voltage $V_{PAD3}$ of the third pad PAD3 has a voltage close to the "high" stored in the first storage unit 415_1. Therefore the value stored in the third storage unit 425_1 may be updated from "low" to "high". Since $R_{TSV}$ is markedly larger than $R_{VAL1}$ and $R_{VAL2}$ when the first through via TSV1 is not normally formed, the voltage $V_{PAD3}$ of the third pad PAD3 has a voltage close to the "low" stored in the third storage unit 425_1. Data corresponding to the voltage of the third pad PAD3 is buffered by the third input buffer 421_1 (not shown in FIG. 5) and is inputted to an input terminal D of the third storage unit 425_1. Accordingly, the value stored in the third storage unit 425_1 may be updated from "low" to "high".

Conversely, even in the case where "low" is stored in the first storage unit 415_1 and "high" is stored in the third storage unit 425_1 as a result of the serial input operation, it may be determined that, through a similar operation procedure as described above, the voltage $V_{PAD3}$ of the third pad PAD3 has a voltage close to the "low" stored in the first storage unit 415_1 when the first through via TSV1 is normally formed and the voltage $V_{PAD3}$ of the third pad PAD3 has a voltage close to the "high" stored in the third storage unit 425_1 when the first through via TSV1 is not normally formed.

That is, when the parallel output operation is performed after different logic values are stored in the corresponding first storage unit 415_1 and third storage unit 425_1, the voltage $V_{PAD3}$ of the third pad PAD3 has a voltage corresponding to the value outputted from the first storage unit 415_1 when the first through via TSV1 is normally formed, and has a voltage corresponding to the value outputted from the third storage unit 425_1 when the first through via TSV1 is not normally formed. Therefore, in the serial input operation, if the value stored in the third storage unit 425_1 and the value updated through the parallel input operation are the same, it is determined that the first through via TSV1 is not normally formed, and, if the value stored in the third storage unit 425_1 and the value updated through the parallel input operation are different, it is determined that the first through via TSV1 is normally formed. In the semiconductor system of FIG. 4, even though the first through via TSV1 is not normally formed and thus the third pad PAD3 is floated, the via test operation may be stably performed.

Figure 6:
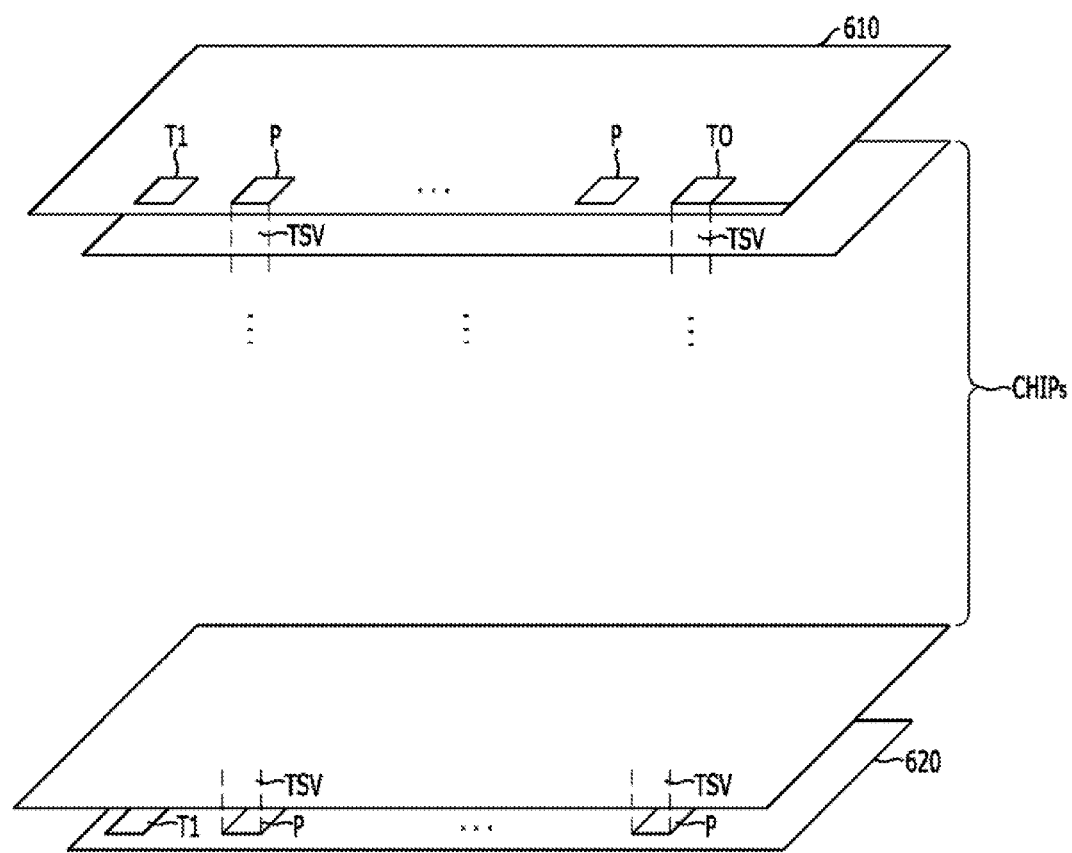
FIG. 6 is a diagram illustrating a semiconductor system in accordance with an embodiment of the present invention.

FIG. 6 is a diagram illustrating a semiconductor system in accordance with an embodiment of the present invention.

Referring to FIG. 6, a semiconductor system may include first to $N^{th}$ semiconductor devices 610, CHIPs and 620. The first to $N^{th}$ semiconductor devices 610, CHIPs and 620 may be stacked. In the semiconductor system, the first semiconductor device 610 may be an uppermost stacked semiconductor device, the $N^{th}$ semiconductor device 620 may be a lowermost stacked semiconductor device, and the remaining semiconductor devices CHIPs may be semiconductor devices which are stacked between the first semiconductor device 610 and the $N^{th}$ semiconductor device 620. Each of the first to $N^{th}$ semiconductor devices 610, CHIPs and 620 may include a plurality of pads P. The pluralities of pads P of the semiconductor devices stacked adjacent to each other may be connected through the through vias TSV. FIG. 6 shows only respective pads P, TI and TO and through vias TSV of the first and $N^{th}$ semiconductor devices 610 and 620 and the stacked shape of the remaining semiconductor devices CHIPs.

Figure 7:
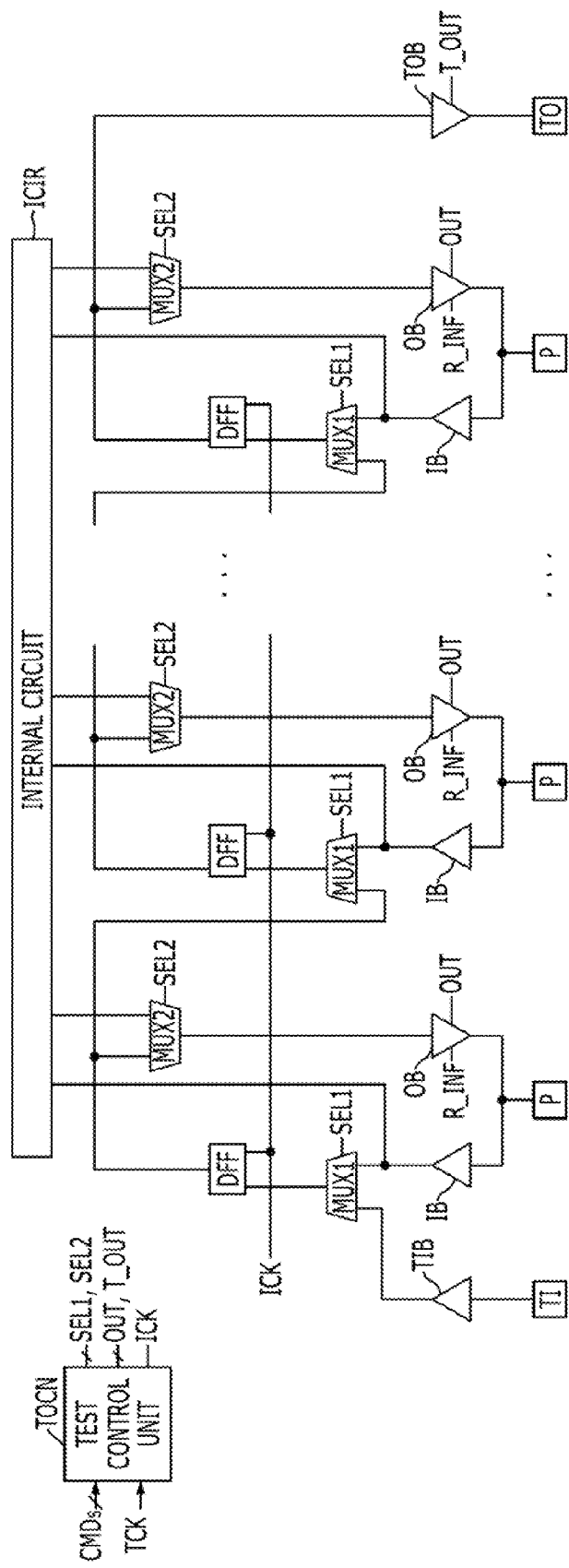
FIG. 7 is a diagram illustrating the first semiconductor device shown in FIG. 6.

FIG. 7 is a diagram illustrating the first semiconductor device 610 shown in FIG. 6. Referring to FIG. 7, the first semiconductor device 610 may include pads P, a test input pad TI, a test output pad TO, input buffers IB, output buffers OB, a test input buffer TIB, a test output buffer TOB, storage units DFF, selection units MUX1 and MUX2, a test control unit TCON, and an internal circuit ICIR.

In the first semiconductor device 610 of FIG. 7, the resistance value of the output buffers OB may be controlled. Even in the remaining semiconductor devices CHIPs and 620, the resistance value of the output buffers OB may be controlled. The resistance value of the output buffers OB of the first semiconductor device 610 may be determined in response to resistance information R_INF, and may have a first resistance value or a second resistance value larger than the first resistance value. In a via test operation, the resistance values of the output buffers OB of the first semiconductor device 610 and the output buffers OB of the $N^{th}$ semiconductor device 620 may be set differently from each other.

The configuration and operation of the first semiconductor device 610 of FIG. 7 may be similar to the configuration and operation of the first semiconductor device 210 of FIG. 3, and the configurations and operations of the remaining semiconductor devices CHIPs and 620 of FIG. 6 may be the same as the configuration and operation of the first semiconductor device 610 of FIG. 7. The semiconductor devices 610, CHIPs and 620 of FIG. 6 may perform (1) a serial input operation, (2) a serial output operation, (3) a parallel input operation, and (4) a parallel output operation according to the control thereof, similar to the first semiconductor device 210 of FIG. 3. Hereinbelow, descriptions will be made mainly for the output buffers OB of the first semiconductor device 610 and the N$^{th}$ semiconductor device 620 and the via test operation.

In the via test operation, the resistance value of the output buffers OB of the first semiconductor device 610 may be set to a first resistance value, and the resistance value of the output buffers OB of the N$^{th}$ semiconductor device 620 may be set to a second resistance value.

Next, as the first semiconductor device 610 performs the serial input operation the data serially inputted through the test input pad TI may be stored in the plurality of storage units DFF. Similarly, as the N$^{th}$ semiconductor device 620 performs the serial input operation, the data serially inputted through the test input pad TI may be stored in the plurality of storage units DFF. For reference, the data inputted through the test input pad TI may be data with a preset pattern. The pattern of the data inputted to and stored in the first semiconductor device 610 and the pattern of the data inputted to and stored in the N$^{th}$ semiconductor device 620 may be opposite to each other.

Then, the first semiconductor device 610 may perform the parallel output operation, and the N$^{th}$ semiconductor device 620 may perform the parallel output operation. The remaining semiconductor devices CHIPs may perform the parallel input operation. As the N$^{th}$ semiconductor device 620 performs the parallel input operation and stores data corresponding to the voltages of the plurality of pads P in the plurality of storage units DFF, the values stored in the plurality of storage units DFF may be updated. The values of data to be stored in the plurality of storage units DFF are determined similarly as described above with reference to FIG. 5. The pads P of the first semiconductor device 610 correspond to the first pad PAD1, and the pads P of the N$^{th}$ semiconductor device 620 correspond to the third pad PAD3. Particularly, in [Mathematical Equation 1], R$_{TSV}$ may correspond to the resistance, value of the entire through vias TSV connected between the pads P of the first semiconductor device 610 and the pads P of the N$^{th}$ semiconductor device 620 but not to the resistance value of one through via.

Finally, as the N$^{th}$ semiconductor device 620 performs the serial output operation, the data stored in the plurality of storage units DFF of the N$^{th}$ semiconductor device 620 may be outputted in series. When the data serially inputted through the test input pad TI of the first semiconductor device 610 and the data serially outputted through the test output pad TO of the N$^{th}$ semiconductor device 620 have the same pattern, it may be determined that the through vias TSV are normally formed. Otherwise, when the data serially inputted through the test input pad TI of the N$^{th}$ semiconductor device 620 and the data serially outputted through the test output pad TO of the N$^{th}$ semiconductor device 620 have the same pattern, it may be determined that the through vias TSV are normally formed. When data patterns are partially different from each other, it may be determined that a through via TSV corresponding to a storage unit DFF which has caused the difference in the data patterns is not normally formed.

The semiconductor system may test whether or not through vias are normally formed, using the circuits, which perform the predetermined operations as described above. Since the circuits are for performing a boundary scan test, the semiconductor system may efficiently perform a via test by performing a via test operation using circuits, which are included for another test.

Figure 8:
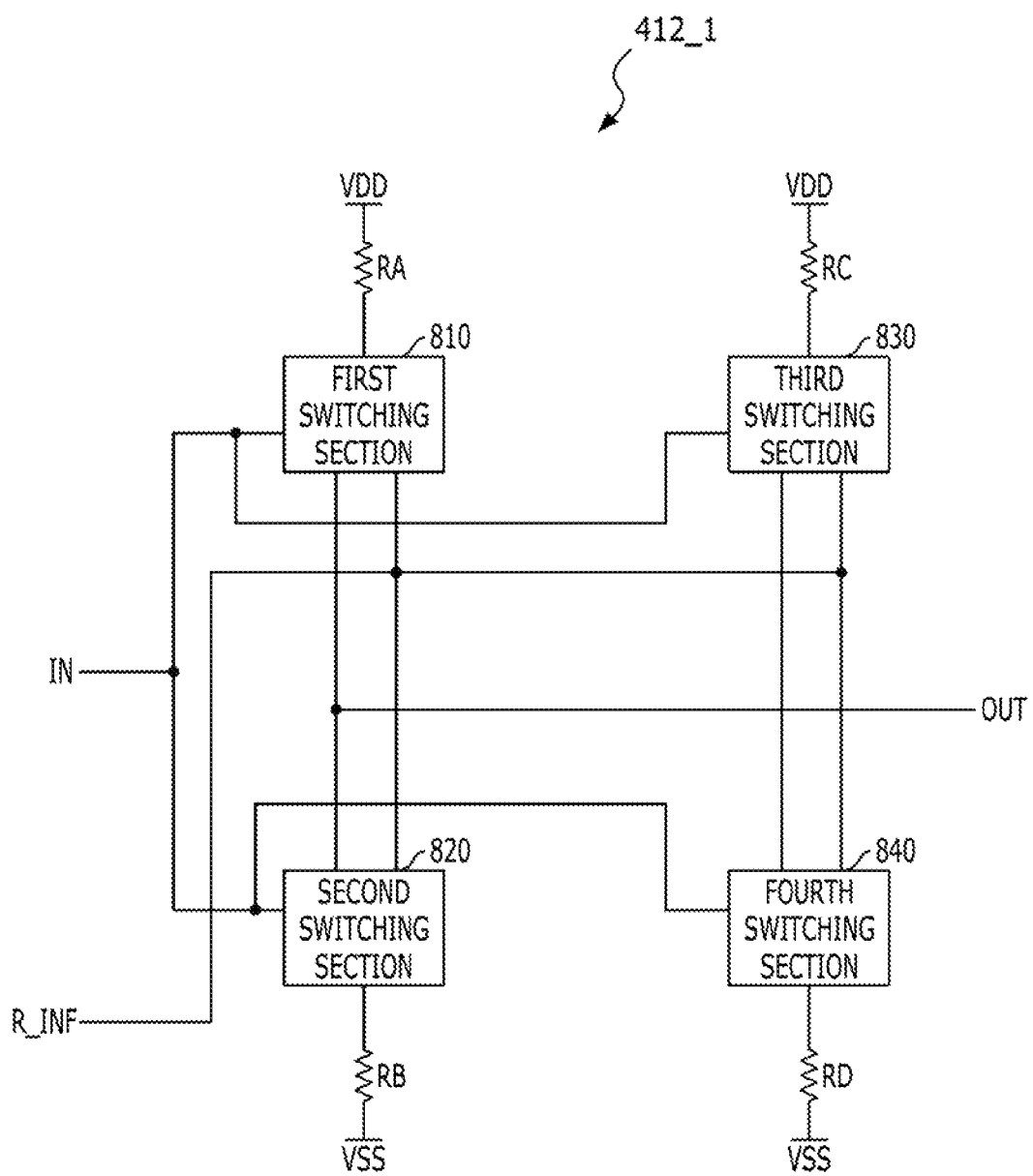
FIG. 8 is a diagram illustrating an output buffer.

FIG. 8 is a diagram illustrating the output buffer 412_1.

As shown in FIG. 8, the output buffer 412_1 may include a plurality of resistor elements RA to RD and a plurality of switching sections 810 to 840. Among the plurality of resistor elements RA to RD, the resistor elements RA and RB may have a first resistance value, and the resistor elements RC and RD may have a second resistance value. Among the plurality of resistor elements RA to RD, the resistor elements RA and RC may be connected to the terminal of a power supply voltage VDD, and the resistor elements RB and RD may be connected to the terminal of a ground voltage VSS.

When an output signal OUT is deactivated, the output buffer 412_1 may be deactivated. When the output signal OUT is activated, the output buffer 412_1 may drive an output node O in response to the data inputted through an input node I.

When the output signal OUT is activated and the resistance value of the output buffer 412_1 is set to the first resistance value by the resistance information R_INF, the first switching section 810 and the second switching section 820 may be activated, and the third switching section 830 and the fourth switching section 840 may be deactivated. When outputting "high" to the output node O, the first switching section 810 may be turned on and the output node O may be pull-up driven to the power supply voltage VDD, and in the case of outputting "low" to the output node O, the second switching section 820 may be turned on and the output node O may be pull-down driven to the ground voltage VSS.

When the output signal OUT is activated and the resistance value of the output buffer 412_1 is set to the second resistance value by the resistance information R_INF, the third switching section 830 and the fourth switching section 840 may be activated, and the first switching section 810 and the second switching section 820 may be deactivated. When outputting "high" to the output node O, the third switching section 830 may be turned on and the output node O may be pull-up driven to the power supply voltage VDD, and when outputting "low" to the output node O, the fourth switching section 840 may be turned on and the output node O may be pull-down driven to the ground voltage VSS.

In addition to the output buffer 412_1, the output buffers 412_2, 422_1 and 422_2 may be configured in substantially the same manner as shown in FIG. 8, and may operate as described above with reference to FIG. 8. The configuration and operation of an output buffer may be designed differently according to a target resistance value to be set.

According to the embodiments of the present disclosure, it is possible to test whether or not through vias connecting the semiconductor devices included in a semiconductor system are normally formed.

According to the embodiments of the present disclosure, since a test is performed using a circuit included in a semiconductor device, a circuit area necessary for testing through vias may be minimized, thus, it is possible to perform an efficient test.

Although various embodiments have been described for illustrative purposes, it will be apparent to those skilled in the art that various changes and modifications may be made without departing from the spirit and scope of the invention as defined in the following claims.

What is claimed is:

1. A semiconductor system comprising:
a first semiconductor device including a first pad, a second pad and a first test input pad, and suitable for storing data inputted in series through the first test input pad and outputting the stored data in parallel through the first pad and the second pad;
a second semiconductor device including a third pad, a fourth pad and a second test output pad, and suitable for storing data inputted in parallel through the third pad and the fourth pad;
a first through via connecting the first pad and the third pad; and
a second through via connecting the second pad and the fourth pad.

2. The semiconductor system according to claim 1, wherein the second semiconductor device outputs in series the stored data through the second test output pad.

3. The semiconductor system according to claim 2, wherein the data inputted to the first semiconductor device through the first test input pad and the data outputted from the second semiconductor device through the second test output pad are compared.

4. The semiconductor system according to claim 1, wherein the first semiconductor device further comprises:
a first test output pad;
a first selection unit suitable for selecting one of the data inputted through the first test input pad and data inputted through the first pad;
a first storage unit suitable for storing and outputting the data selected by the first selection unit;
a second selection unit suitable for selecting one of the data outputted from the first storage unit and data outputted from a first internal circuit;
a third selection unit suitable for selecting one of the data outputted from the first storage unit and data inputted through the second pad;
a second storage unit suitable for storing and outputting the data selected by the third selection unit; and
a fourth selection unit suitable for selecting one of the data outputted from the second storage unit and the data outputted from the first internal circuit,
wherein the data outputted from the second storage unit are transferred to the first test output pad.

5. The semiconductor system according to claim 4, wherein, when the data inputted through the first test input pad are stored in the first semiconductor device, the first selection unit selects the data inputted through the first test input pad and the third selection unit selects the data outputted from the first storage unit, and
wherein, when the data stored in the first semiconductor device are outputted through the first pad and the second pad, the second selection unit selects the data outputted from the first storage unit, and the fourth selection unit selects the data outputted from the second storage unit.

6. The semiconductor system according to claim 4, wherein the second semiconductor device comprises:
a second test input pad;
a fifth selection unit suitable for selecting one of data inputted through the second test input pad and data inputted through the third pad;
a third storage unit suitable for storing and outputting the data selected by the fifth selection unit;
a sixth selection unit suitable for selecting one of the data outputted from the third storage unit and data outputted from a second internal circuit;
a seventh selection unit suitable for selecting one of the data outputted from the third storage unit and data inputted through the fourth pad;
a fourth storage unit suitable for storing and outputting the data selected by the seventh selection unit; and
an eighth selection unit suitable for selecting one of the data outputted from the fourth storage unit and the data outputted from the second internal circuit,
wherein the data outputted from the fourth storage unit are transferred to the second test output pad.

7. The semiconductor system according to claim 6, wherein, when the data inputted through the third pad and the fourth pad are stored in the second semiconductor device, the fifth selection unit selects the data inputted through the third pad and the seventh selection unit selects the data inputted through the fourth pad, and
wherein, when data stored in the second semiconductor device are outputted through the second test output pad, the eighth selection unit selects the data outputted from the fourth storage unit.

8. The semiconductor system according to claim 1, wherein the first semiconductor device transfers the data inputted through the first pad and the second pad, to the first internal circuit in a data input operation, and outputs data transferred from the first internal circuit to the first pad and the second pad in a data output operation, and
wherein the second semiconductor device transfers the data inputted through the third pad and the fourth pad, to the second internal circuit in a data input operation, and outputs data transferred from the second internal circuit to the third pad and the fourth pad in a data output operation.

9. A semiconductor system comprising:
first to Nth semiconductor devices each including a plurality of pads, the first to Nth semiconductor devices being sequentially stacked such that the plurality of pads of adjacent semiconductor devices are connected to each other by through vias, respectively,
wherein the first semiconductor device further includes a test input pad, stores data inputted in series through the test input pad, and outputs in parallel the stored data through corresponding pads among the plurality of pads, and
wherein the Nth semiconductor device further includes a test output pad, stores the data inputted in parallel through the corresponding pads among the plurality of pads, and outputs in series the stored data through the test output pad.

10. The semiconductor system according to claim 9, wherein the data inputted to the first semiconductor device through the test input pad and the data outputted from the Nth semiconductor device through the test output pad are compared.

* * * * *